United States Patent [19]

Young

[11] Patent Number: 4,646,023
[45] Date of Patent: Feb. 24, 1987

[54] NUCLEAR MAGNETIC RESONANCE IMAGING

[75] Inventor: Ian R. Young, Sunbury-on-Thames, England

[73] Assignee: Picker International Ltd., Wembley, England

[21] Appl. No.: 742,922

[22] Filed: Jun. 10, 1985

[30] Foreign Application Priority Data

Jun. 13, 1984 [GB] United Kingdom ............... 8415078

[51] Int. Cl.⁴ .......................................... G01R 33/20
[52] U.S. Cl. .................................. 324/309; 324/307
[58] Field of Search .............. 324/300, 307, 309, 312, 324/315, 310, 313, 314

[56] References Cited

U.S. PATENT DOCUMENTS

| | | | |
|---|---|---|---|
| 4,318,044 | 3/1982 | Mansfield | 324/309 |
| 4,361,807 | 11/1982 | Burl et al. | 324/310 |
| 4,506,223 | 3/1985 | Bottomley | 324/307 |
| 4,513,247 | 4/1985 | Ernst | 324/309 |
| 4,520,316 | 5/1985 | Hall et al. | 324/309 |
| 4,553,096 | 11/1985 | Randell | 324/309 |
| 4,558,279 | 12/1985 | Ackerman | 324/315 |
| 4,581,582 | 4/1986 | Redington | 324/309 |
| 4,585,992 | 4/1986 | Maudsley | 324/312 |
| 4,585,993 | 4/1986 | Bottomley | 324/309 |
| 4,588,948 | 5/1986 | Mansfield | 324/309 |

FOREIGN PATENT DOCUMENTS

| | | |
|---|---|---|
| 0123200 | 10/1984 | European Pat. Off. . |
| 2057142 | 3/1981 | United Kingdom . |
| 2128339 | 4/1984 | United Kingdom . |

OTHER PUBLICATIONS

Manassen et al.; "A Constant Gradient Experiment for Chemical-Shift Imaging", *Journal of Magnetic Resonance* 61, 363-370 (1985).

Primary Examiner—Michael J. Tokar
Attorney, Agent, or Firm—Timothy B. Gurin

[57] ABSTRACT

An NMR chemical shift imaging method and apparatus wherein a number of experiments are performed with different encoding gradients sufficient to obtain a desired spatial resolution in the image, and each of said number of experiments is repeated for each of a number of different delay times between excitation and the start of data collection sufficient to obtain a desired chemical shift resolution in the image.

5 Claims, 3 Drawing Figures

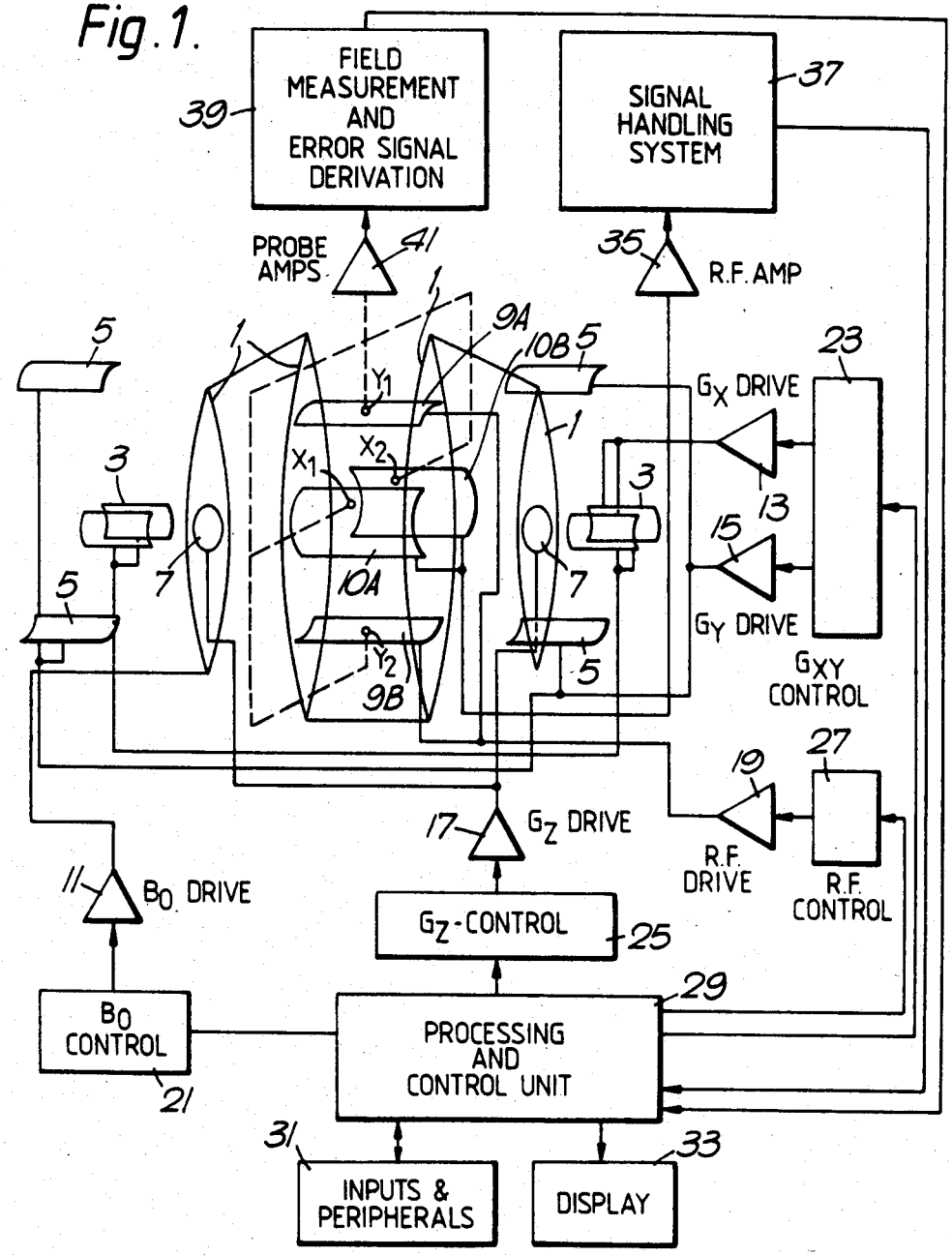

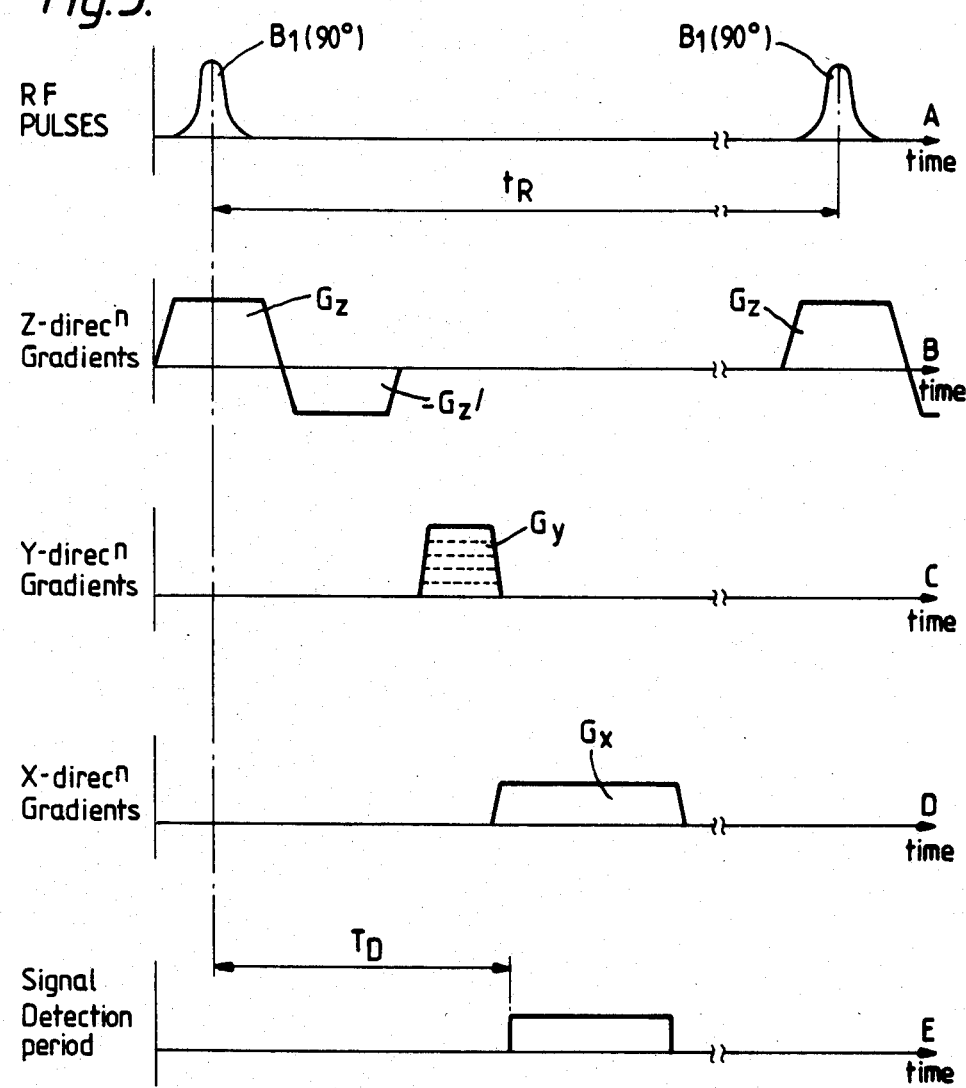

NUCLEAR MAGNETIC RESONANCE IMAGING

This invention relates to nuclear magnetic resonance (NMR) imaging methods and apparatus.

More particularly the invention relates to such methods and apparatus wherein the image obtained exhibits chemical shift information.

By "chemical shift" is meant the relatively small shift in the Larmor frequency of a nucleus which is caused by electrons screening the nucleus from an applied magnetic field. The exact shielding caused by the electrons depends on the chemical environment of the nucleus, and this differs for an element in different chemical compounds.

In known NMR chemical shift imaging methods nuclear spins are first excited in a selected region of a body to be examined. Magnetic field gradients are then applied to the selected region to encode the spins and the spins detected. The experiment is then repeated a number of times with different gradients and the resulting sets of detected NMR spin signals are processed to recover image information using Fourier transformation techniques.

If chemical shift information were not required the sets of signals would be processed simply to recover positional information e.g. in the case of a planar slice, by means of a two-dimensional Fourier transform. When chemical shift information is additionally required, the sets of signals are further processed by carrying out a further Fourier transform with respect to time. This yields chemical shift information since the detectable NMR spin signals from an excited nucleus arise at a time after excitation of that nucleus dependent on the chemical shift of that nucleus.

In known chemical shift imaging processes wherein the gradients only are changed between different experiments, such as is described in United Kingdom Patent Specification No. 2,125,388 A, each gradient must be changed individually a number of times dependent on the required resolution of the image. Thus for a planar slice of $n \times n$ pixels where two orthogonal gradients are applied, $n^2$ experiments are required. A total data acquisition time of $n^2 t_R$ is therefore required, where $t_R$ is the experiment repetition time.

It is an object of the present invention to provide an NMR chemical shift imaging method and apparatus whereby the total data acquisition time may be reduced.

According to the present invention there is provided an NMR chemical shift imaging method wherein: a plurality of experiments are performed each comprising: preferentially exciting nuclear spins in a selected region of a body, applying a magnetic field gradient to encode the excited spins, and collecting data representing the resultant encoded spins; and the data collected during all the experiments is processed to recover spatial and chemical shift image information, characterised in that: a number of experiments with different encoding gradients are performed to provide spatial image information; and each of said number of experiments is repeated for each of a number of different delay times between excitation and data collection to provide chemical shift image information.

The invention also provides apparatus arranged to carry out the method according to the invention.

One method and apparatus in accordance with the invention will now be described by way of example with reference to the accompanying drawings in which:

FIGS. 1 and 2 illustrate the apparatus diagrammatically; and

FIG. 3 is a diagram illustrating the sequence of steps involved in the method.

The apparatus is for the most part of conventional form, for example, as described in UK Patent Specifications Nos. 1,578,910 and 2,056,078, and in the corresponding U.S. Patent Specifications Nos. 4,284,948 and 4,355,282.

The basic elements of such an apparatus are as follows:

The apparatus includes a first coil system whereby a magnetic field can be applied to a body to be examined in a given direction, normally designated the Z-direction, with a gradient in any one or more of the three orthogonal directions i.e. X, Y and Z directions.

Referring to FIG. 1, the first coil system comprises coils 1 which provide a steady uniform magnetic field Bo in the Z-direction; coils 3 which provide a magnetic field gradient Gx in the X-direction, coils 5 which provide a magnetic field gradient Gy in the Y-direction; and coils 7 which provide a magnetic field gradient Gz in the Z-direction.

In addition, the apparatus includes a second coil system whereby RF magnetic fields can be applied to the body under examination in a plane normal to the direction of the magnetic field produced by the first coil system, and whereby RF magnetic fields resulting from nuclei in the body under examination which have been excited to nuclear magnetic resonance with a spin vector component other than in the Z-direction can be detected.

The second coil system comprises a first coil arrangement comprising a pair of coils 9A and 9B for applying RF fields, and a second coil arrangement comprising coils 10A and 10B for detecting RF fields.

The various coils 1, 3, 5, 7 and 9A and 9B are driven by Bo, Gx, Gy, Gz and RF drive amplifiers 11, 13, 15, 17 and 19 respectively, controlled by Bo, Gxy, Gz and RF control circuits 21, 23, 25 and 27 respectively. These circuits may take various forms which are well known to those with experience of NMR equipment and other apparatus using coil induced magnetic fields.

The circuits 21, 23, 25 and 27 are controlled by a central processing and control unit 29 with which are associated inputs and other peripherals 31, for the provision of commands and instructions to the apparatus, and a display 33.

The NMR signals detected by the coils 10A and 10B are applied via an amplifier 35 to a signal handling system 37. The signal handling system is arranged to make any appropriate calibration and correction of the signals, but essentially transmits the signals to the processing and control unit 29 wherein the signals are processed for application to the display to produce an image representing the distribution of an NMR quantity in the body being examined.

It will be appreciated that whilst shown separately to clarify the present description, the signal handling system 37 may conveniently form part of the unit 29.

The apparatus also includes field measurement and error signal circuits 39 which receive signals via amplifiers 41 from field probes $X_1$, $X_2$, $Y_1$ and $Y_2$ which are disposed at suitable positions in relation to the body 43 being examined, as illustrated in FIG. 2, to monitor the applied magnetic fields.

A method of operating the apparatus of FIG. 1 and 2 in accordance with the invention will now be described with reference to FIG. 3.

The steady magnetic field Bo is first applied by means of coils 1, this field serving to define an equilibrium axis of magnetic alignment in the region of the body being examined, i.e. along the Z-direction, and remaining constant throughout the examination procedure.

A magnetic field gradient is then applied to the body in a direction normal to a planar slice of the body to be imaged, e.g. a gradient Gz along the Z-direction by means of coils 7, (see FIG. 3B). Together with this gradient there is applied an RF magnetic field pulse denoted B1 (90°) for reasons explained hereafter (see FIG. 3A). The frequency of the RF field is chosen to be at the Larmor frequency of chosen nuclei, typically hydrogen protons, in the slice of the body being examined. The slice is defined by a particular magnetic field gradient along the Z-direction such that nuclei within the slice are preferentially excited. The integral of the RF pulse is such that the pulse is just sufficient to tip the spins of the excited nuclei into the X-Y plane, and is therefore referred to as a 90° pulse, the spins then precessing in the X-Y plane around the Z-axis.

The field gradient Gz is then removed and replaced by a gradient in the opposite sense $-Gz'$. This causes the rephasing of the spins which have been selctively excited by the combination of the RF pulse B1 (90°) and the gradient Gz. The magnitude of gradient $-Gz'$ is chosen so that the spins are rephased at the time this gradient is removed, as described for example, in UK Patent Specification No. 1,578,910 and U.S. Pat. Specification No. 4,284,948.

At a chosen time after removal of the $-Gz'$ gradient a field gradient Gy (see FIG. 3C) is applied in the plane of the slice by means of coils 5. This serves to phase encode in known manner the excited spins in the slice.

After the gradient Gy has been removed a gradient Gx in the plane of the slice (see FIG. 3D) is applied by means of coils 3, this serving further to encode the spins by dispersing the frequencies of the spins in the slice in known manner.

As illustrated in FIG. 3E, during application of the gradient Gx, data is collected by detecting the nuclear spins in the slice having a component in the X-Y plane by means of coils 10A and 10B and the resulting detected signal is stored.

The above described process is repeated a number of times using a different value for the Gy gradient each time. It will be appreciated that between each B1 (90°) pulse a period $t_R$ is allowed to elapse to allow relaxation of spins.

The above described process is then repeated a number of times with a different chosen value of the delay time TD between excitation and the start of detection each time.

For each change in the value of the delay time TD, the time of application of the gradient Gx is correspondingly shifted i.e. so that in each experiment the start of detection occurs at the same time after the application of the gradient Gx.

The stored signals are then processed in known manner using a two-dimensional Fourier transform process with respect to the two orthogonal directions X and Y to obtain spatial spin distribution information and a further Fourier transform process with respect to time to obtain chemical shift information.

If n is the number of different values of the gradient Gy which is used, a spatial resolution of n×n pixels is obtained. The chemical shift resolution obtained is a function of the number of different values of the time delay TD which is used. Thus, where as is frequently the case in medical imaging, only a low chemical shift resolution is required, e.g. to distinguish between hydrogen protons in water and hydrogen protons in lipids to obtain information about fatty infiltration, a small number of different values of TD beyond the minimum needed (which is two) e.g. eight, is often sufficient to generate adequate quality data, with a peak value of TD of the order of 50 to 60 milliseconds. A total data acquisition time of 8 $nt_R$ is then required compared with a data acquisition time of $n^2 T_R$ with the known comparable methods mentioned above.

It will be appreciated that in a method according to the invention the order in which the various experiments required to obtain a full set of data are done is not important.

It will be understood that whilst in the particular method according to the invention described by way of example a two-dimensional Fourier transformation image construction technique is used, in alternative methods other image construction techniques such as the so-called back projection technique may be used. In such an alternative method, instead of collecting data for various values of a phase encoding gradient, Gy in the above example, data is collected for each of a number of different directions of a frequency encoding gradient applied during actual detection of the spins.

I claim:

1. An NMR chemical shift imaging method wherein: a plurality of experiments are performed each comprising: preferentially exciting nuclear spins in a selected region of a body, applying a magnetic field gradient to include the excited spins, and collecting data representing the resultant encoded spins; and the data collected during all the experiments is processed to recover spatial and chemical shift image information, characterised in that: a number of experiments with different encoding gradients are performed to provide spatial image information; and each of said number of experiments is repeated for each of a number of different delay times between excitation and data collection to provide chemical shift image information.

2. A method according to claim 1 wherein during each said experiment data collection occurs during application of a magnetic field gradient and for each change in said delay time, the time of application of said gradient is correspondingly changed.

3. A method according to claim 1 wherein in each said experiment said encoding gradient comprises a phase encoding gradient applied between excitation and data collection, whose value is different for each of said number of experiments.

4. A method according to claim 1 wherein in each said experiment said encoding gradient comprises a gradient applied during data collection whose direction is different for each of said number of experiments.

5. A method according to claim 1 wherein said number of different delay times is less than said number of experiments.

* * * * *